United States Patent [19]

Noll

[11] Patent Number: 4,852,737

[45] Date of Patent: Aug. 1, 1989

[54] PACKAGING SYSTEM FOR ELECTRICAL CONNECTORS

[75] Inventor: Willan B. Noll, Harrisburg, Pa.

[73] Assignee: AMP Incorporated, Harrisburg, Pa.

[21] Appl. No.: 274,580

[22] Filed: Nov. 22, 1988

[51] Int. Cl.$^4$ .............................................. B65D 73/02
[52] U.S. Cl. .................................... 206/330; 206/328; 206/329; 206/332; 206/485
[58] Field of Search ............... 206/328, 329, 330, 341, 206/345, 346, 347, 390, 486, 485, 490, 332; 53/397

[56] References Cited

U.S. PATENT DOCUMENTS

| | | |
|---|---|---|
| 3,443,683 | 5/1969 | Felty, Jr. et al. . |
| 3,590,481 | 7/1971 | Felty et al. . |
| 3,650,706 | 3/1972 | Parsons . |
| 4,314,641 | 2/1982 | Bronne ................................. 206/486 |
| 4,583,641 | 4/1986 | Gelzer .................................. 206/329 |
| 4,621,486 | 11/1986 | Slavicek ............................. 206/330 |
| 4,633,370 | 12/1986 | Hamuro et al. ..................... 206/330 |
| 4,757,895 | 7/1988 | Gelzer ................................ 206/330 |

*Primary Examiner*—David T. Fidei

[57] ABSTRACT

This invention is directed to a packaging system, discrete packages or continuous tape, for electrical connectors, or the like, comprising an elongated, essentially planar sheet or strip-like member, where said member includes one or more longitudinal rows of cavities on each side thereof. Each cavity is suitable for containing an electrical connector, or the like. A portion of said sheet or strip-like member is skewed at an angle relative to the longitudinal direction of said member to form a common wall for a pair of said opposing cavities. Each cavity is further defined by a pair of side walls joined together by an end wall. The system further includes a flexible restraining strip for maintaining said connectors, or the like, in said cavities. The strip comprises an elongated strip overlying said connectors, or the like, where each said strip is operable for securing along a longitudinal row of cavities, and is joined to an opposing such strip operable for securing the opposing row of cavities. For a continuous tape, for use in automatic dispensing mechanism, indexing apertures may be provided for cooperatively engaging movable projections on said mechanism.

12 Claims, 1 Drawing Sheet

U.S. Patent     Aug. 1, 1989     4,852,737
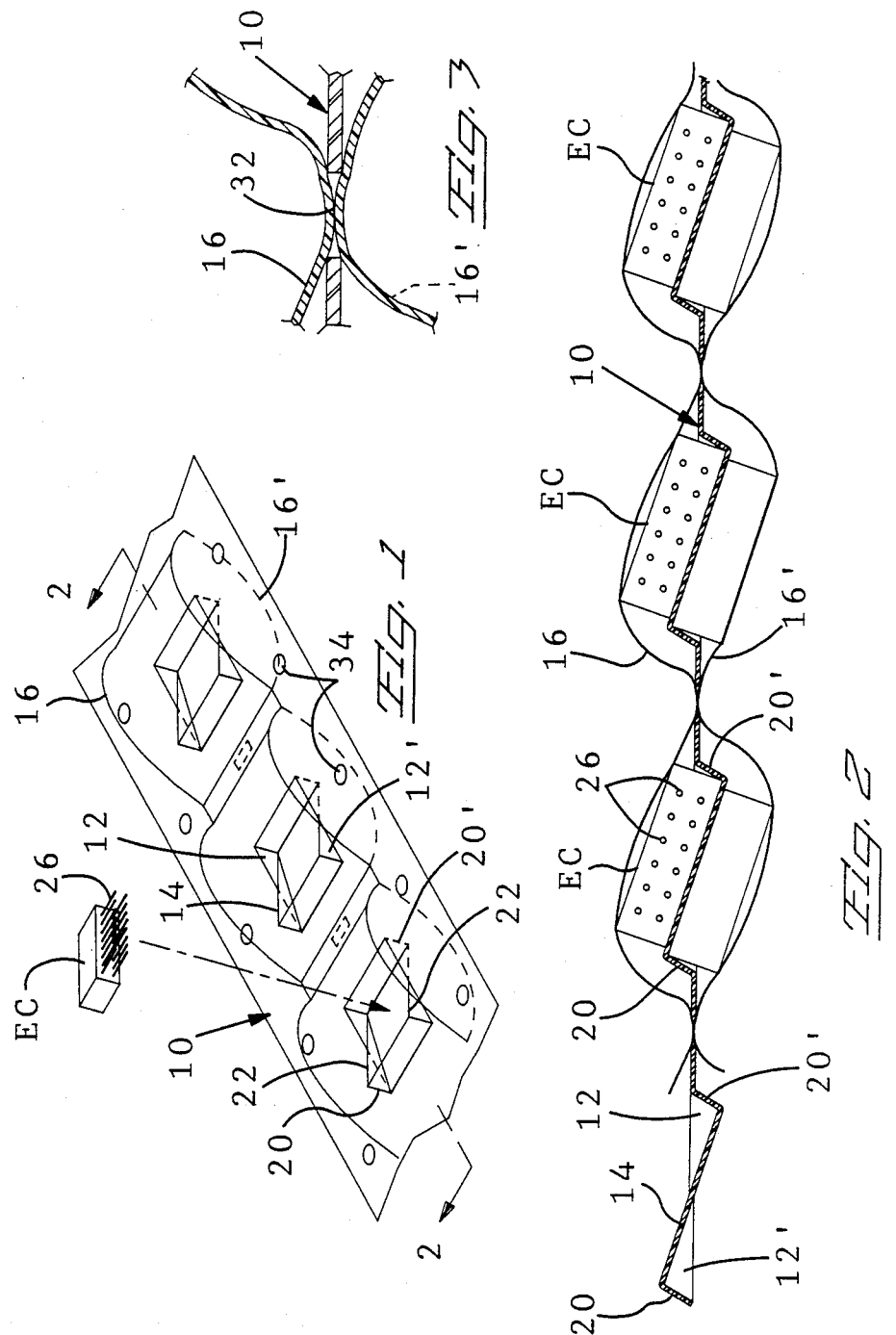

PACKAGING SYSTEM FOR ELECTRICAL CONNECTORS

FIELD OF THE INVENTION

This invention relates to a packaging system, discrete or continuous tape, for receiving and retaining electrical connectors of the type having contact leads extending outwardly from a surface thereof.

BACKGROUND OF THE INVENTION

Packaging systems, such as magazines or trays, made of thin plastics material are now used predominantly to ship and handle electrical connectors and components. More recently, magazines and trays have been adapted to be used with robotics equipment; e.g., in mounting electrical connectors onto printed circuit boards.

Known magazines, such as taught in U.S. Pat. No. 3,184,056 to Kisor, and trays, as taught in U.S. Pat. No. 4,671,407 to Brutosky, have a single layer of one row. Such a construction, i.e., a single layer, has heretofore been the only structure available for electrical connectors having leads extending outwardly from one surface thereof. For these type connectors, shoulders are required to support the connectors so that the leads can extend into a space to prevent damage thereto and to permit the connectors to slide freely into and out of the row or rows. Multiple layers of connectors are provided by stacking discrete magazines and trays on top of each other. In an effort to improve upon this system and also to economize, one worker in the field, Brutosky, provided trays having downwardly extending skirts which provided an end cover for the underlying tray to confine the connectors during shipping and handling. The aforementioned U.S. Pat. No. 4,671,407 discloses this feature.

U.S. Pat. No. 4,583,641 to Gelzer teaches an article packaging system which is a continuous carrier tape onto which articles, such as electrical connectors, are mounted. The connectors, with their leads inserted into locating holes in the carrier tape, are secured against such tape by an overlapping bonding strip. The bonding strip is secured to such tape b an interlocking means intermediate the contained articles, i.e. connectors in this exemplary teaching.

In the practice of this invention, it is proposed to provide a packaging system in which it is possible to double up on the articles to be contained by such system, as well as to provide a means to protect such articles, such as electrical connectors which have plural leads projecting therefrom.

BRIEF DESCRIPTION OF DRAWINGS

FIG. 1 is a perspective of one embodiment of a packaging system according to this invention, it being understood that embodiments containing multiple rows of packaged articles are contemplated hereby.

FIG. 2 is a sectional view taken along line 2—2 of FIG. 1.

FIG. 3 is an enlarged, partial sectional view showing one manner by which opposing restraining strips, under the system of this invention, are joined to one another.

SUMMARY OF THE INVENTION

This invention is directed to a packaging system for electrical connectors, or the like, comprising an elongated, essentially planar sheet or strip-like member, where said member includes one or more longitudinal rows of cavities on each side thereof. Each cavity is suitable for containing an electrical connector, or the like. A portion of said sheet or strip-like member is skewed at an angle relative to the longitudinal direction of said member to form a common wall for a pair of said opposing cavities. Each cavity is further defined by a pair of side walls joined together by an end wall. The system further includes a restraining strip for maintaining said connectors, or the like, in said cavities. The strip comprises a flexible, elongated strip overlying said connectors, or the like, where each said strip is operable for securing along a longitudinal row of cavities, and is joined to an opposing such strip operable for securing the opposing row of cavities.

DETAILED DESCRIPTION OF PREFERRED EMBODIMENT

The present invention is directed to a unique and economical packaging system which is particularly suitable for packaging electrical connectors of the type having contact leads extending outwardly from a surface thereof.

One embodiment of the invention is illustrated in FIG. 1, where such invention is shown as comprising an elongated, essentially planar strip 10 having a row of longitudinally arranged cavities 12,12' on each side of such strip. The strip 10 may be of a discrete length, as desired for the packaged articles, or an essentially endless strip for automated packaging and dispensing. Additionally, plural rows of opposing cavities are contemplated hereby. In all such cases, the packaging concepts are identical, i.e. opposing cavities 12,12', having a common wall 14, and a pair of longitudinally disposed restraining strips 16,16'.

Returning now to the several figures, each cavity 12,12' is defined by an end wall 20,20', and a pair of side walls 22 extending between such end walls 20,20'. By such arrangement, a cavity 12,12' is formed into which an electrical connector EC may be placed. As shown in the projection of FIG. 1, the contacts or legs 26 of connectors EC project in a lateral direction, suitably protected from inadvertent or handling damage, but not having to be inserted in holes in the strip 10. Electrical connectors of the type described above are well known in the art. Exemplary illustrations of such connectors are presented in U.S. Pat. Nos. 3,467,944 to Hammell et al, 3,932,934 to Lynch et al and 4,464,007 to Parmer.

It is contemplated by this invention that the strip may be designed to accommodate electrical connectors of varying sizes, seated in suitable sized cavities, so long as the cavities may be longitudinally arranged whereby the contained connectors may be secured therein by means to be described hereinafter.

The electrical connectors EC are retained in the respective cavities 12,12' by means of restraining strips 16,16', preferably formed of a flexible plastic-like material. Such material must be sufficiently flexible to conform in part to the shape of the contained connectors so as to bear against such connectors in a way to hold the connectors within the cavities 12,12'.

Between longitudinally disposed cavities, an opening 30 is provided in strip 10 whereby converging strips 16,16' may come together to be joined 32 in a suitable manner, such as by heat fusion. The manner of joining such strips 16,16' must be such that only a limited effort is required to separate the strips to permit removal of the underlying connectors. One advantage in this preferred manner of securing the restraining strips together is that the strip 10 is unaffected and therefore suitable for reuse for packaging further electrical connectors, or the like. Notwithstanding such preferred strip joining practice, other suitable means of joining the strips 16,16' may be used so long as there is adequate integrity in the joint for handling and shipping, while permitting the separation thereof for access to the connectors.

Finally, as shown in FIG. 1, edge or marginal apertures 34 may be provided along strip 10 to permit control in the automatic indexing and dispensing of connectors. Such apertures may be designed to cooperate with a driven sprocket wheel, of a conveyancing means, where such wheel is provided with projections which engage with apertures 34, for automatic operation. Cooperative means, such as a lifting bar, may be included with such conveyancing means to separate strips 16,16', along with a robotic system to engage and place each connector as it is freed from the restraining strips 16,16'.

I claim:

1. A packaging system for electrical connectors, or the like, comprising
   (a) an elongated, essentially planar sheet or strip-like member, said member including one or more longitudinal rows of cavities on each side thereof, each such cavity being suitable for containing an electrical connector, or the like, where a portion of said sheet or strip-like member is skewed at an angle relative to the longitudinal direction of said member to form a pair of said opposing cavities, each said cavity being further defined by a pair of side walls joined together by an end wall, and
   (b) a restraining strip for maintaining said connectors, or the like, in said cavities, said strip comprising a flexible, elongated strip overlying said connectors, or the like, where each said strip is operable for securing along a longitudinal row of cavities and is joined to an opposing such strip operable for securing the opposing row of cavities.

2. The packaging system for electrical connectors, or the like, according to claim 1, wherein said planar sheet is provided with through openings between longitudinally adjacent cavities, and that opposing restraining strips converge to be joined at each said opening.

3. The packaging system for electrical connectors, or the like, according to claim 2, wherein said restraining strips are weakly joined to allow for the separation thereof and access to the contained electrical connectors, or the like.

4. The packaging system for electrical connectors, or the like, according to claim 2, wherein said planar strip is provided with a plurality of rows of longitudinally disposed said cavities, and that each said row has a pair of cooperative restraining strips for securing electrical connectors, or the like, in said cavities.

5. The packaging system for electrical connectors, or the like, according to claim 1, wherein said side walls of said cavities merge into said planar sheet remote from said end wall.

6. The packaging system for electrical connectors, or the like, according to claim 5, wherein said end walls of each cavity of said pairs of opposing cavities are located at opposite ends thereof.

7. The packaging system for electrical connectors, or the like, according to claim 6, wherein said end walls project outwardly from said planar sheet at an oblique angle relative thereto.

8. A packaging system for electrical connectors, or the like, comprising:
   (a) an elongated planar strip having cavities formed therein on both surfaces thereof for receiving said electrical connectors, or the like, said cavities being defined by an end wall projecting outwardly from said strip, parallel, spaced apart side walls extending from said end wall and a floor wall, said floor wall being common to pairs of directly opposing cavities on opposite surfaces of said strip; and
   (b) removable restraining means for restraining components in said cavities.

9. The packaging system for electrical connectors, or the like, according to claim 8, wherein said planar strip is provided with through openings between longitudinally adjacent cavities, and that said removable restraining means cooperate therewith to restrain said connectors in said cavities.

10. The packaging system for electrical connectors, or the like, according to claim 8, wherein said side walls of said cavities merge into said planar strip remote from said end wall.

11. The packaging system for electrical connectors, or the like, according to claim 10, wherein said end walls of each cavity of said pairs of opposing cavities are located at opposite ends thereof.

12. The packaging system for electrical connectors, or the like, according to claim 11, wherein said end walls project outwardly from said planar strip at an oblique angle relative thereto.

* * * * *